United States Patent
Ozaki (10) Patent No.: US 9,077,295 B2
(45) Date of Patent: Jul. 7, 2015

(54) CLASS D AMPLIFICATION DEVICE

(75) Inventor: Seigo Ozaki, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 797 days.

(21) Appl. No.: 13/381,223

(22) PCT Filed: May 19, 2010

(86) PCT No.: PCT/JP2010/003377
§ 371 (c)(1), (2), (4) Date: Dec. 28, 2011

(87) PCT Pub. No.: WO2011/001591
PCT Pub. Date: Jan. 6, 2011

(65) Prior Publication Data
US 2012/0099743 A1  Apr. 26, 2012

(30) Foreign Application Priority Data

Jun. 29, 2009 (JP) ................. 2009-153392

(51) Int. Cl.
*H03F 99/00* (2009.01)
*H03F 3/217* (2006.01)
*H03F 1/02* (2006.01)
*H03F 1/32* (2006.01)
*H03F 3/24* (2006.01)

(52) U.S. Cl.
CPC ............ *H03F 3/2173* (2013.01); *H03F 1/0205* (2013.01); *H03F 1/3205* (2013.01); *H03F 3/245* (2013.01)

(58) Field of Classification Search
USPC ........ 330/10, 207 A, 251; 332/115, 116, 109; 375/353, 238; 381/120, 121
See application file for complete search history.

(56) References Cited

U.S. PATENT DOCUMENTS

| 5,929,665 A | 7/1999 | Ichikawa et al. |
| 6,016,075 A * | 1/2000 | Hamo .............................. 330/10 |
| 2006/0103459 A1* | 5/2006 | Ma .................................. 330/10 |

(Continued)

FOREIGN PATENT DOCUMENTS

| JP | 04-043706 A | 2/1992 |
| JP | 10-337046 A | 12/1998 |

(Continued)

OTHER PUBLICATIONS

International Search Report for International Application No. PCT/JP2010/003377, Aug. 17, 2010, Panasonic Corporation.

*Primary Examiner* — Vivian Chin
*Assistant Examiner* — Friedrich W Fahnert
(74) *Attorney, Agent, or Firm* — RatnerPrestia (57) ABSTRACT

A controller 103 that conducts various controls corresponding to input information selects target voltage information and target dead time information corresponding to input audio signal level information from data table information, outputs the target voltage information to a variable power supply unit 104, and outputs the target dead time information associated with the target voltage information to a dead time generator 105, to thereby set an output supply voltage and a dead time corresponding to an input audio signal level in a half bridge circuit 107. Accordingly, there can be provided a class D amplification device that can minimize the dead time and reduce distortion while suppressing the amount of heat generation caused by a through-current.

18 Claims, 12 Drawing Sheets

(56) References Cited

U.S. PATENT DOCUMENTS

| | | |
|---|---|---|
| 2006/0208794 A1* | 9/2006 | Morishima .................... 330/10 |
| 2007/0258180 A1* | 11/2007 | Honda et al. ................. 361/139 |
| 2009/0146737 A1 | 6/2009 | Guo et al. |
| 2009/0174485 A1* | 7/2009 | Teng et al. ................... 330/298 |
| 2009/0238382 A1* | 9/2009 | Unou et al. .................. 381/120 |

FOREIGN PATENT DOCUMENTS

| | | |
|---|---|---|
| JP | 2004-128639 A | 4/2004 |
| JP | 2004-179945 A | 6/2004 |
| JP | 2005-033349 A | 2/2005 |
| JP | 2009-141935 A | 6/2009 |

\* cited by examiner

| INPUT SIGNAL LEVEL | TARGET SUPPLY VOLTAGE INFORMATION | | TARGET DEAD TIME INFORMATION (TIME) | |
|---|---|---|---|---|
| | COEFFICIENT a | COEFFICIENT b | COEFFICIENT a | COEFFICIENT b |
| 0V | 2V | 4V | 2nS | 4nS |
| 0.2V | 5V | 8V | 5nS | 8nS |
| 0.4V | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |

FIG. 3

| INPUT SIGNAL LEVEL | TARGET SUPPLY VOLTAGE INFORMATION | | TARGET DEAD TIME INFORMATION (RESISTANCE) | |
|---|---|---|---|---|
| | COEFFICIENT a | COEFFICIENT b | COEFFICIENT a | COEFFICIENT b |
| 0V | 2V | 4V | 2Ω | 4Ω |
| 0.2V | 5V | 8V | 5Ω | 8Ω |
| 0.4V | ⋮ | ⋮ | ⋮ | ⋮ |
| → | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |

| | TARGET SUPPLY VOLTAGE INFORMATION | | TARGET DEAD TIME INFORMATION (RESISTANCE) | |
|---|---|---|---|---|
| | COEFFICIENT a | COEFFICIENT b | COEFFICIENT a | COEFFICIENT b |
| STEP1 | 2V | 4V | 2Ω | 4Ω |
| STEP2 | 5V | 8V | 5Ω | 8Ω |
| STEP3 | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |

VOLUME INFORMATION →

| OUTPUT VOLTAGE INFOR-MATION | DEAD TIME VALUE (RESISTANCE VALUE) | | | |
|---|---|---|---|---|
| | COEFFICIENT a | COEFFICIENT b | COEFFICIENT c | COEFFICIENT d |
| 2V | 2Ω | 4Ω | | |
| 3V | 3Ω | 6Ω | ⋮ | ⋮ |
| 4V | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |
| | ⋮ | ⋮ | ⋮ | ⋮ |

FIG. 12

CLASS D AMPLIFICATION DEVICE

This Application is a U.S. National Phase Application of PCT International Application PCT/JP2010/003377.

TECHNICAL FIELD

The present invention relates to a class D amplifier that sets a dead time for paired switching elements, and changes the dead time according to a state of an input signal to obtain an excellent audio characteristic.

BACKGROUND ART

In a conventional class D amplification device, an output PWM signal, which is an output signal obtained by switching (on/off) a constant voltage obtained from a DC power supply, is input to a low-pass filter (LPF), and demodulated to an analog audio signal to reproduce sound.

In high-speed switching elements (MOS field effect transistors) of a highside disposed on a higher potential power supply side and a lowside disposed on a lower potential power supply (or ground) side in a half bridge circuit, a delay occurs in rising and falling of the switching due to input capacitance characteristics or variation of an element. For that reason, in order to reduce a through-current caused by turning on the paired switching elements at the same time, a dead time is intentionally provided so as to turn off both of those switching elements at the rising and falling times of a switching element driving PWM signal which is input to gates of the switching elements of the highside and the lowside.

If the dead time is increased for suppressing heat generation, a dead zone in which an output voltage is not detected as an input signal occurs in the vicinity of a low output voltage. As a result, an audio output amplitude is decreased and distorted to largely affect a sound quality. That is, the heat generation generated by the through-current and the deterioration of the sound quality due to distortion generated by the dead time have a relationship of tradeoff.

As the conventional class D amplification device, there has been known a digital switching amplifier in which, in order to flexibly control the dead time so as to suppress a through-current flowing in a bridge circuit at the time of reproducing a large volume of sound while suppressing the distortion of a reproduced signal at the time of reproducing a small volume of sound, a dead time controller controls, in cooperation with a volume controller, the dead time to be decreased when the small volume of sound is reproduced by the volume controller, and to be increased when the large volume of sound is reproduced (for example, refer to Patent Document 1).

PRIOR ART DOCUMENTS

Patent Document 1: JP-A-2004-179945

SUMMARY OF THE INVENTION

Problem to be Solved by the Invention

However, in the conventional class D amplification device, because a supply voltage to be applied to a power supply side of each switching element is kept constant, the amount of heat generation obtained by a constant voltage value and the through-current between the switching elements cannot be suppressed to a given amount or lower, resulting in such a problem that a reduction in the dead time is limited.

The present invention has been made to solve the problem with the conventional art, and aims at providing a class D amplification device which can minimize the dead time to reduce the distortion while suppressing the amount of heat generation attributable to the through-current.

Means for Solving the Problem

According to the present invention, there is provided a class D amplification device that includes a bridge circuit having a plurality of switching elements, and controls the switching elements of the bridge circuit to switch a DC supply voltage and amplify a power of an audio signal input to the subject device, the class D amplification device including a controller that sets a dead time of a signal for switching the switching elements and a voltage value of the DC supply voltage according to an input signal level of the input audio signal.

Also, according to the present invention, there is provided a class D amplification device that includes a bridge circuit having a plurality of switching elements, and controls the switching elements of the bridge circuit to switch a DC supply voltage and amplify a power of an audio signal input to the subject device, the class D amplification device including a controller that sets a dead time of a signal for switching the switching elements and a voltage value of the DC supply voltage according to volume adjustment information for adjusting an output signal level output by the subject device.

According to the present invention, there is provided a class D amplification device that includes a bridge circuit having a plurality of switching elements, and controls the switching elements of the bridge circuit to switch a DC supply voltage and amplify a power of an audio signal input to the subject device, the class D amplification device including a controller that sets a voltage level of the DC supply voltage according to an input signal level of the input audio signal, and a conversion controller that sets a dead time of a signal for switching the switching elements according to an output voltage level of the DC supply voltage.

With the above configuration, the amount of heat generation in the switching elements can be suppressed by lowering the DC supply voltage value at a small input signal level, and the distortion can be improved by selecting a small dead time of the values associated with the DC supply voltage value.

Advantages of the Invention

According to the present invention, there can be provided the class D amplification device in which, with the provision of the controller that sets the dead time of the signal for switching the switching elements and the output voltage value of the DC supply voltage according to the input signal level of the audio signal, the amount of heat generation in the switching elements can be suppressed by lowering the DC supply voltage value particularly at the small input signal level, and the distortion can be improved by selecting the small dead time of the values associated with the DC supply voltage value to perform both of the higher sound quality and the higher efficiency.

MODES FOR CARRYING OUT THE INVENTION

Hereinafter, embodiments of the present invention will be described with reference to the drawings.

(First Embodiment)

Hereinafter, a description will be given of a class D amplification device according to a first embodiment of the present invention with reference to the drawings.

Figure 1:
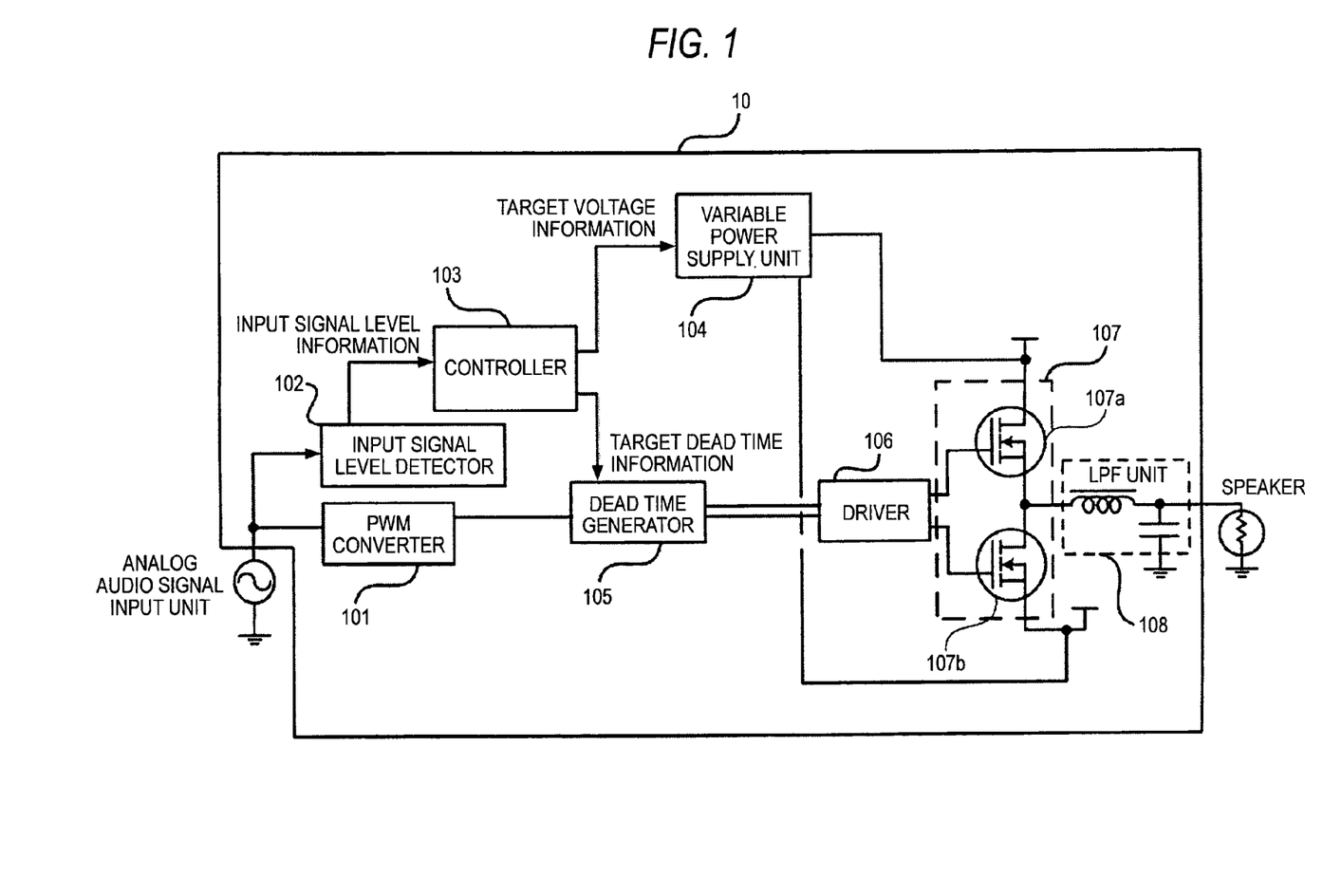
FIG. 1 is a block diagram of a class D amplification device according to a first embodiment of the present invention.

The class D amplification device according to the first embodiment of the present invention is illustrated in FIG. 1.

Referring to FIG. 1, a class D amplification device 10 includes a PWM converter 101 that converts an analog audio signal input from an external device such as a CD player or a DVD player into a PWM signal, an input signal level detector 102 that outputs a signal level of an input audio signal as input signal level information, a controller 103 that receives the input signal level information output from the input signal level detector 102, and conducts various controls corresponding to the input information, a variable power supply 104 that supplies an electric power to high-speed switching elements at a voltage level variously controlled following target voltage information output by the controller 103, a dead time generator 105 that conducts control for setting the dead time for the PWM signal following target dead time information output by the controller 103, a driver 106 that drives the high-speed switching elements according to a switching element driving PWM signal having the dead time set by the dead time generator 105, a half bridge circuit 107 configured by highside and lowside high-speed switching elements 107a and 107b, and a low-pass filter unit 108 that demodulates an output PWM signal, which is obtained by switching a variable output supply voltage output from the variable power supply 104 in response to the switching element driving PWM signal for which the dead time is set, to an audio signal.

The operation of the class D amplification device configured as described above will be described. When the analog audio signal output from an external equipment connected to the class D amplification device 10, such as a TV set, a radio receiver, a CD player, or a DVD player, the PWM converter 101 subjects the input audio signal to PWM modulation, and outputs the PWM signal.

Simultaneously, the input signal level detector 102 creates the input signal level information including amplitude information on the input audio signal, and outputs the input signal level information to the controller 103. For example, the controller 103 including, for example, a digital signal processor or a microcomputer, selects the target voltage information and the target dead time information corresponding to the input signal level information input from the input signal level detector 102 from data table information set within the controller 103 in advance. Then, the controller 103 outputs the target voltage information, which is information indicative of a target value of the voltage value to be set for the variable power supply 104, and also outputs the target dead time information, which is information indicative of a target value of the dead time to be set for the dead time generator 105.

As a value of the dead time, a value necessary for not destroying the switching elements 107a and 107b, which is required for the dead time, is determined taking, into account, a delay time of a rising waveform determined according to physical characteristics such as an input capacity of the switching elements 107a and 107b, an output supply voltage value applied to the respective elements, the amount of heat generation allowed by the switching elements, and a variation thereof.

The above-mentioned data table information is configured such that the dead time is set to a smaller value while the output supply voltage is decreased at a smaller input signal level, and the dead time is set to a larger value while output supply voltage is increased at a larger input signal level, on the basis of the value of the necessary dead time thus determined.

Figure 2:
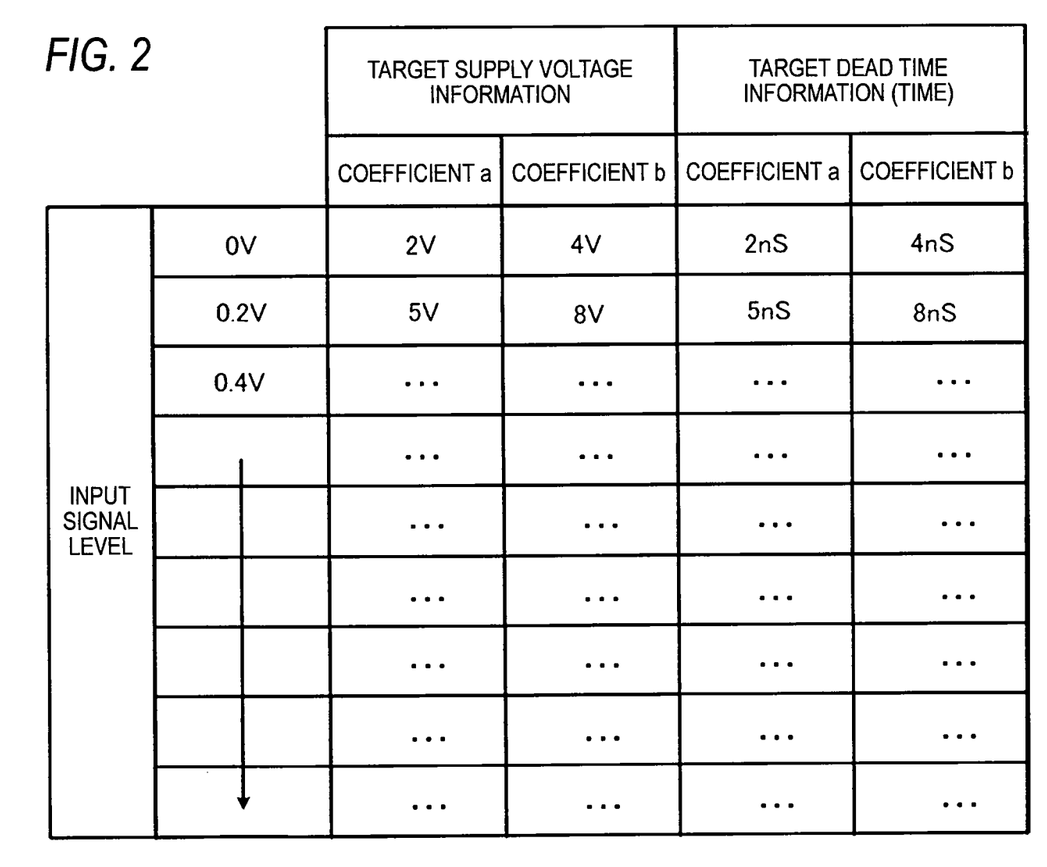
FIG. 2 illustrates data table information according to the first embodiment of the present invention.
Figure 3:
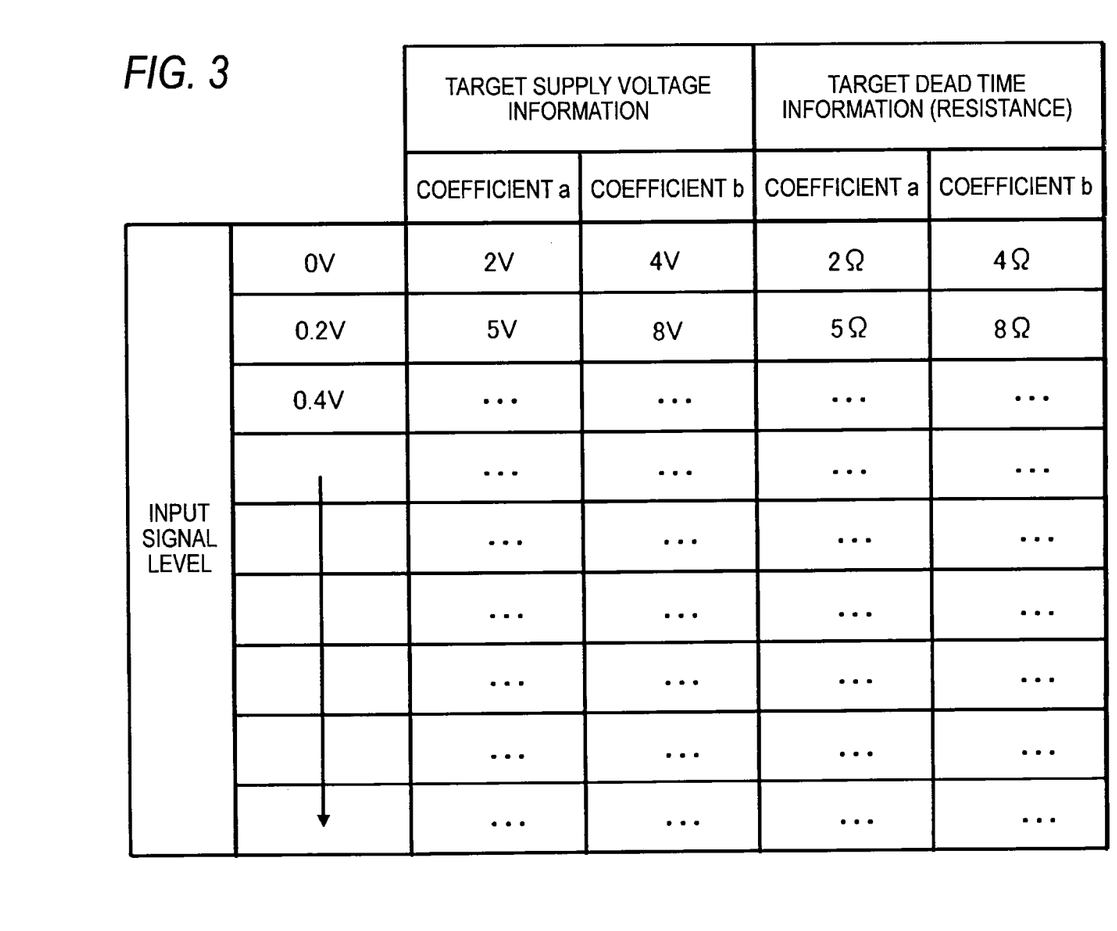
FIG. 3 illustrates the data table information according to the first embodiment of the present invention.
Figure 4:
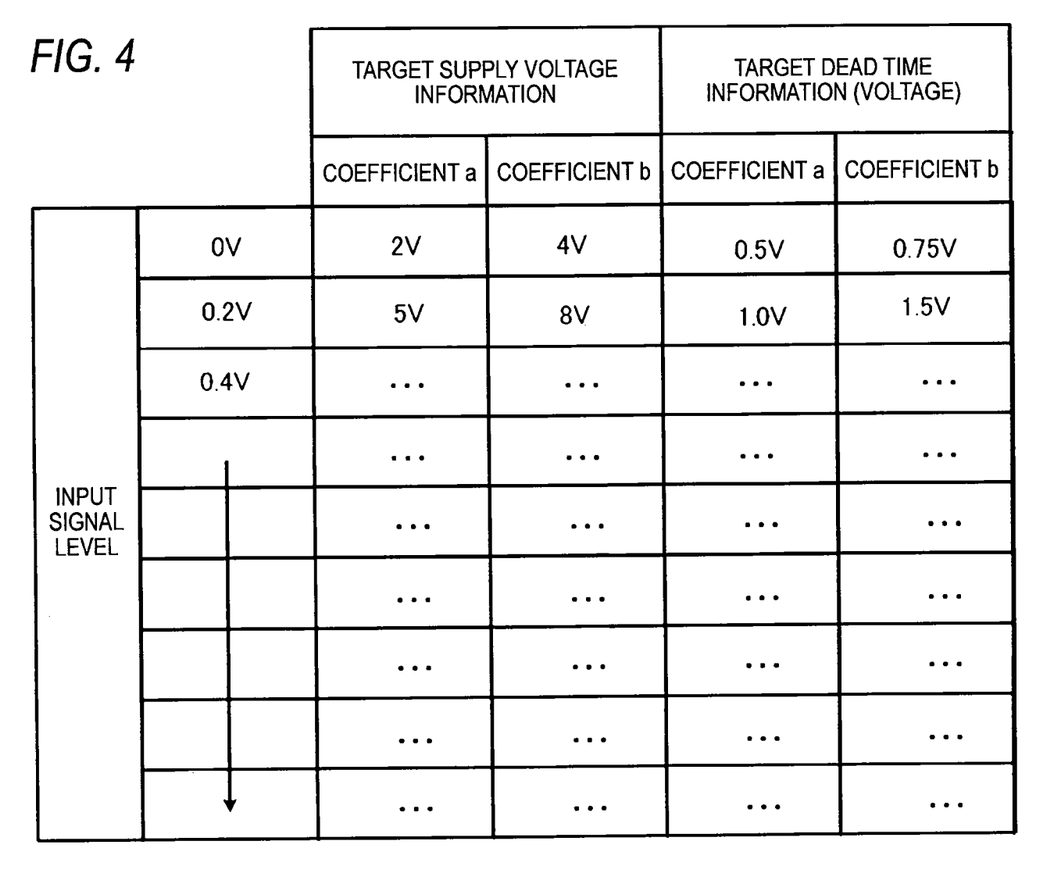
FIG. 4 illustrates the data table information according to the first embodiment of the present invention.

For example, as illustrated in FIGS. 2 to 4, the target dead time information is configured by a format of a unit time, a resistance value, or a voltage value, and may be selected in correspondence with a dead time generating method of the dead time generator 105 in advance.

Further, as the target dead time information, several coefficients can be set and selected in correspondence with information on an ambient temperature of the switching elements as information that can be obtained from a temperature detection element by the controller 103 by using the temperature detection element such as a thermistor not shown. For example, in FIGS. 2 to 4, the respective values corresponding to a coefficient a may be selected when the ambient temperature is lower, and the respective values corresponding to a coefficient b may be selected when the ambient temperature is higher. the controller 103 outputs the target dead time information set in the selected coefficient to the dead time generator 105.

When the controller 103 outputs the target voltage information selected from the data table information configured as described above to the variable power supply 104, the variable power supply 104 applies the power to the switching elements 107a and 107b at the value of the output voltage that is variably controlled following the target voltage information.

Further, the dead time generator 105 conducts control for setting the dead time for the PWM signal output from the PWM converter 101 following the target dead time information input from the controller 103.

In this example, as the dead time generating method by the dead time generator 105, there may be used a method provided by the technical documents that have already disclosed several dead time generating method.

In this embodiment, a system in which the resistance value is variable is used as an example. This system will be described with reference to FIG. 5. The dead time generator 105 converts the PWM signal output from the PWM converter 101 into switching element driving PWM signals for driving the two (paired) switching elements 107a and 107b at the highside and the lowside.

Figure 5:
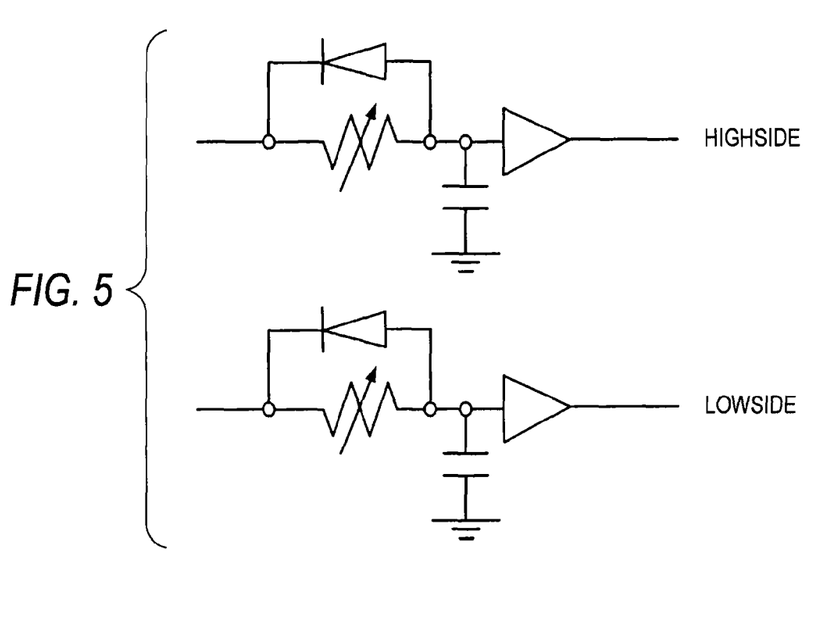
FIG. 5 is a circuit diagram illustrating a dead time generating method according to the first embodiment of the present invention.

The two switching element driving PWM signals are input to respective filter circuits each configured by a capacitor connected between a variable resistive element connected in series with a signal transmission line and a GND grounding point. A delay occurs at a rising time due to a time constant of the filter circuit. Because there is no influence of the resistive element at a falling time due to a diode connected in parallel to the variable resistive element, no delay occurs due to the time constant. As a result, a timing shift caused by the delay occurs in the two highside and lowside switching element driving PWM signals to form the dead time. A dead time value can be varied by changing the resistive value of the variable resistive element.

The driver 106 controls the switching operation of the switching elements 107a and 107b in correspondence with the switching element driving PWM signals for which the dead time is set. The half bridge circuit 107 configured by N-channel MOS field effect transistors as the highside and lowside switching elements 107a and 107b outputs the output PWM signal obtained by switching a variable output supply voltage applied from the variable power supply 104 to the low-pass filter unit 108. The output PWM signal passes through the low-pass filter unit 108, and is then demodulated into the audio signal, and a speaker drives the demodulated audio signal to reproduce sound.

As described above, in the class D amplification device 10 according to the present invention, the controller 103 selects the target voltage information and the target dead time information corresponding to the input audio signal level information from the data table information, outputs the target voltage information to the variable power supply 104, outputs the target dead time information associated with the target voltage information to the dead time generator 105, thereby realizing the supply voltage and the dead time corresponding to the input audio signal level in the half bridge circuit 107. According to this configuration, the amount of heat generation in the high-speed switching elements can be suppressed by lowering the output supply voltage value particularly at the small input signal level, and the distortion can be improved by selecting the small dead time of the values associated with the output supply voltage value.

Figure 6:
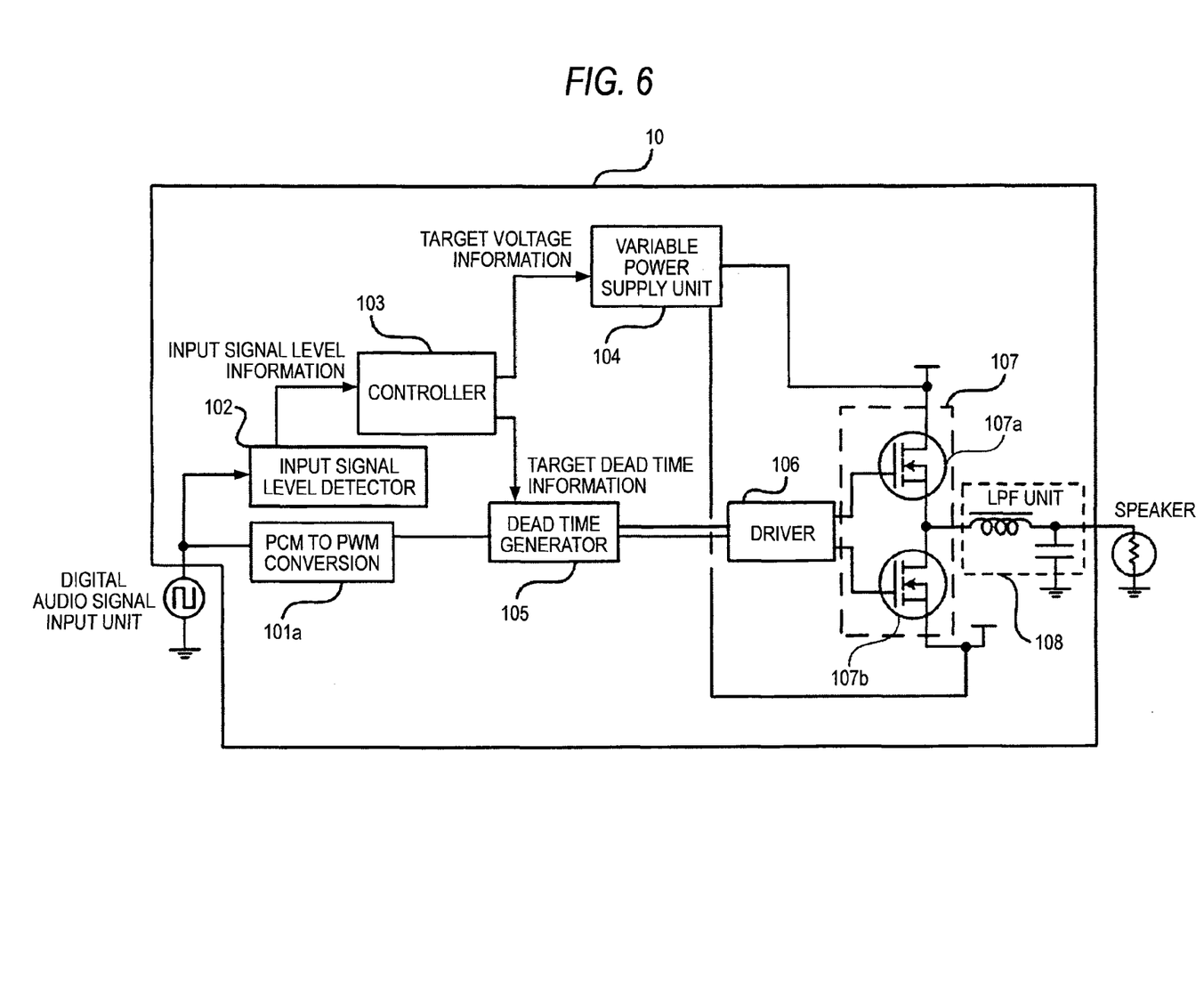
FIG. 6 is a block diagram of another example of a class D amplification device according to the first embodiment of the present invention.

Also, in the above description, when a digital audio signal such as a PCM is input instead of the analog audio signal, as illustrated in FIG. 6, the PWM converter 101 is replaced with a PCM-PWM converter 101a as a PWM converter that converts a digital audio input signal into the PWM signal. As a result, the same implementation as that in the above embodiment is enabled, and the same advantages are obtained.

(Second Embodiment)

Hereinafter, a class D amplification device according to a second embodiment of the present invention will be described with reference to the drawings.

Figure 7:
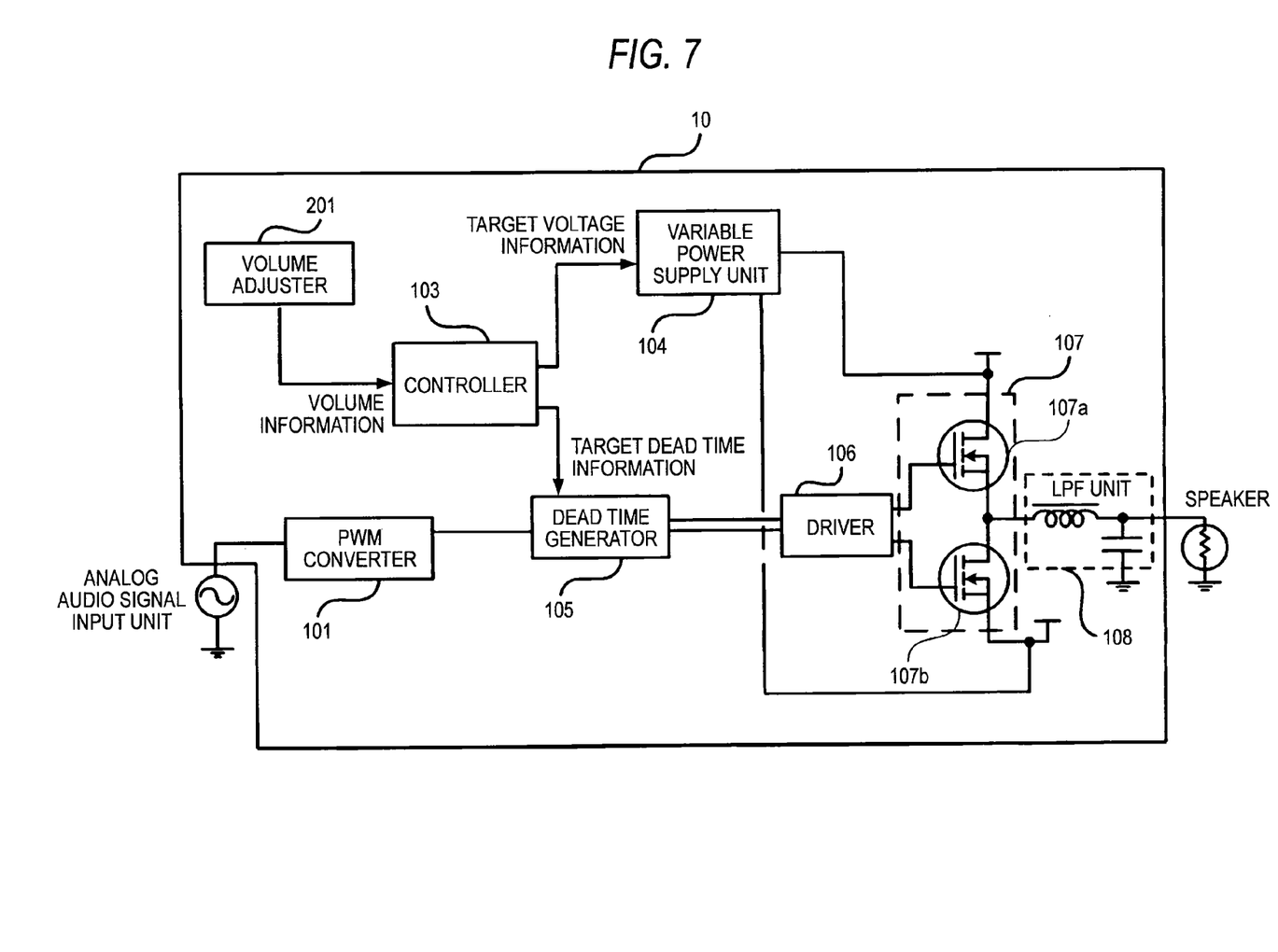
FIG. 7 is a block diagram of a class D amplification device according to a second embodiment of the present invention.

The class D amplification device according to the second embodiment of the present invention is illustrated in FIG. 7.

In the second embodiment of the present invention, a volume adjuster 201 for adjusting a magnitude (output audio signal level) of the output audio signal to be reproduced is added to the class D amplification device of FIG. 1 illustrating the first embodiment.

The operation of the class D amplification device configured as described above will be described. The same configurations as those in the first embodiment will be omitted from description. Referring to FIG. 2, the volume adjuster 201 outputs volume adjustment information represented by, for example, the number of steps to the controller 103 as information for adjusting the magnitude of the output audio signal output by the subject device.

The controller 103 selects the target voltage information and the target dead time information corresponding to the volume information such as the number of steps input from the volume adjuster 201, from the target dead time information set within the controller 103 in advance, outputs the target voltage information to the variable power supply 104, and outputs the target dead time information to the dead time generator 105.

Figure 8:
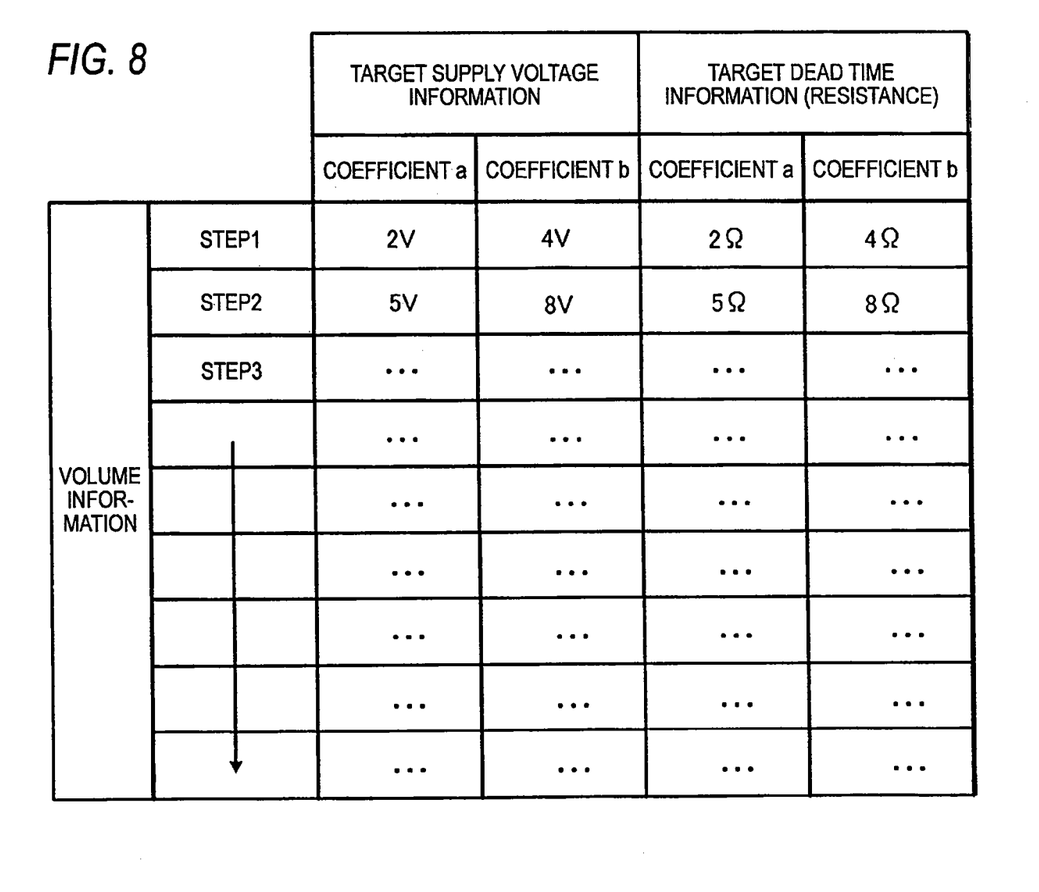
FIG. 8 illustrates data table information according to the second embodiment of the present invention.

The data table information in the above-mentioned second embodiment is based on the value of the necessary dead time which is determined in the same manner as that of the value determined in the first embodiment, and configured such that the dead time is set to a smaller value while decreasing the output supply voltage when a smaller volume is selected, and the dead time is set to a larger value while increasing the output supply voltage when a larger volume is selected as illustrated in FIG. 8.

As in the first embodiment, for example, the target dead time information can be selected in advance in correspondence with the dead time generating method of the dead time generator 105 by using a format such as the unit time or the voltage value without being limited to the format using the resistive value as illustrated in FIG. 8. Further, the coefficients a and b can be selectively used according to the ambient temperature.

With the use of the data table information thus configured, the target voltage information and the target dead time information corresponding to the volume information are selected from the data table information, the target voltage information is output to the variable power supply 104, and the target dead time information associated with the target voltage information is output to the dead time generator 105. As a result, the same advantages as those in the first embodiment can be obtained.

As described above, in the class D amplification device 10 according to the present invention, the controller 103 selects the target voltage information and the target dead time information corresponding to the volume information from the data table information, outputs the target voltage information to the variable power supply 104, and outputs the target dead time information associated with the target voltage information to the dead time generator 105, to thereby realize the output supply voltage and the dead time corresponding to the volume information in the half bridge circuit 107. According to this configuration, the amount of heat generation in the high-speed switching elements can be suppressed by lowering the output supply voltage value particularly at the small input signal level, and the distortion can be improved by selecting the small dead time of the values associated with the output supply voltage value.

Figure 9:
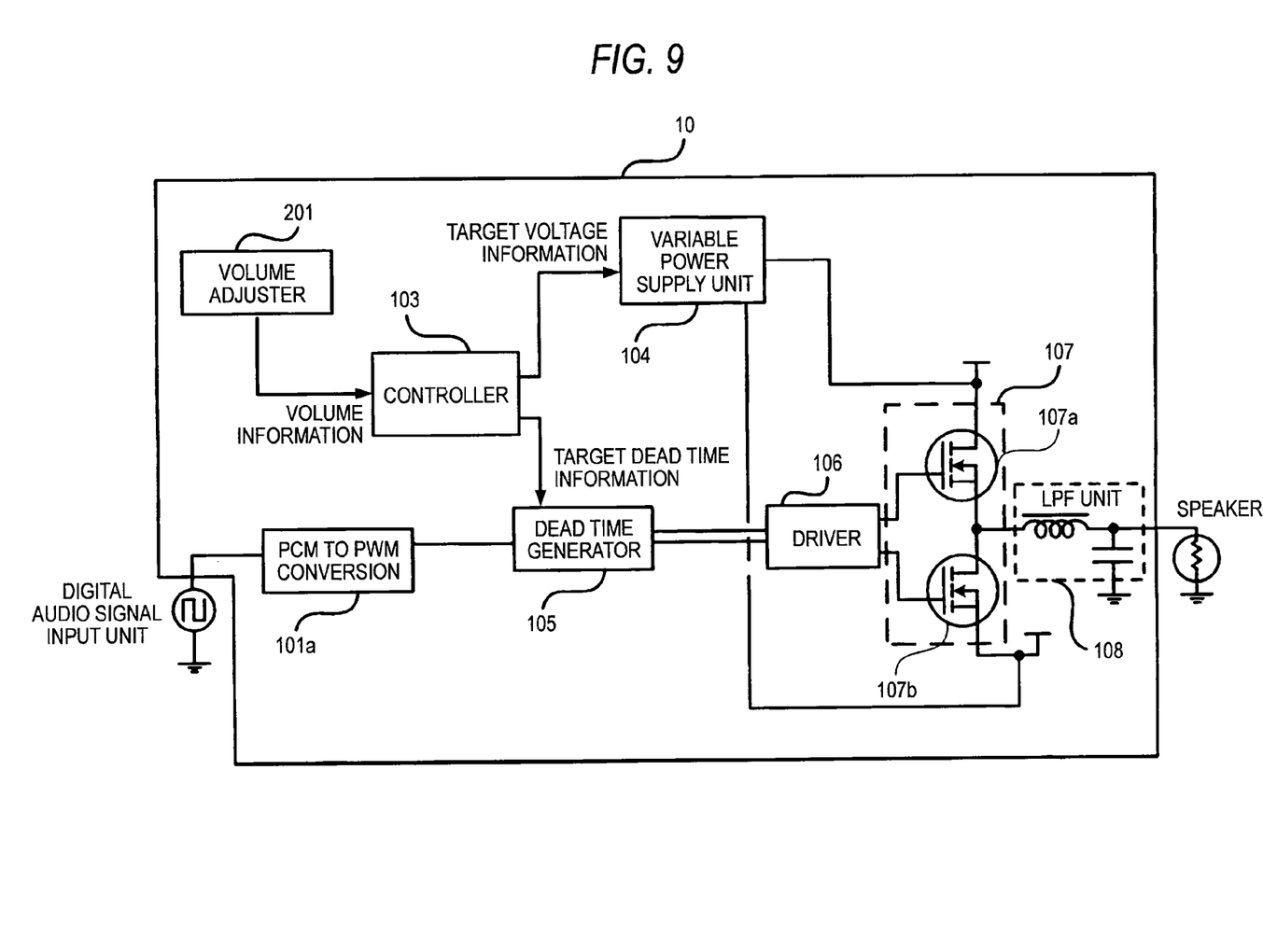
FIG. 9 is a block diagram of another example of the class D amplification device according to the second embodiment of the present invention.
Figure 10:
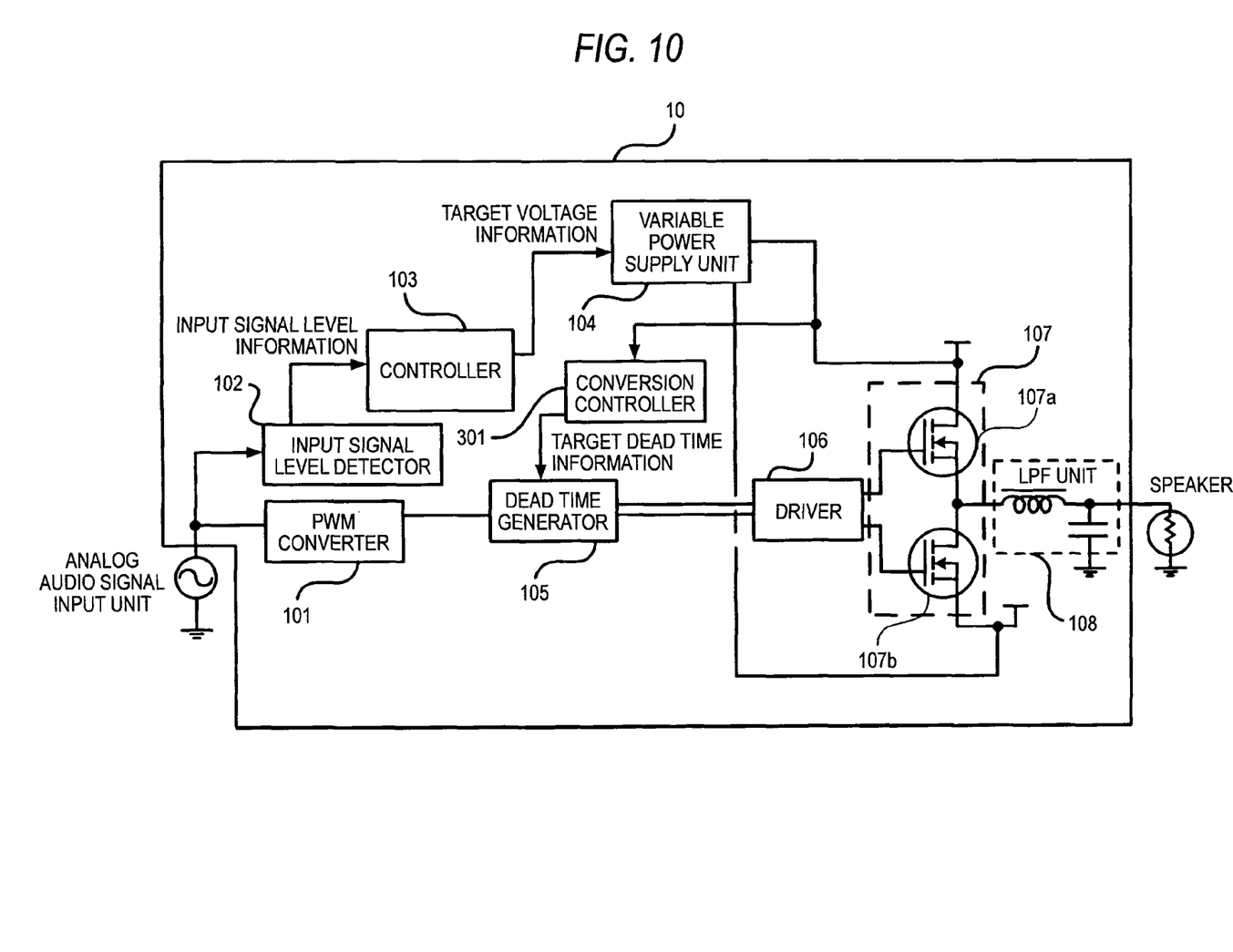
FIG. 10 is a block diagram of a class D amplification device according to a third embodiment of the present invention.

Also, in the above description, when the digital audio input signal such as a PCM is input instead of the analog audio signal, as illustrated in FIG. 9, the PWM converter 101 is replaced with the PCM-PWM converter 101a with the results that the same implementation as that in the above embodiment is enabled, and the same advantages can be obtained.

(Third Embodiment)

Hereinafter, a class D amplification device according to a third embodiment of the present invention will be described with reference to the drawings.

The class D amplification device according to the third embodiment of the present invention is illustrated in FIG. 3.

In the third embodiment of the present invention, a conversion controller 301 that controls the conversion from the output voltage information into the target dead time information is added to the class D amplification device of FIG. 1 illustrating the first embodiment.

The operation of the class D amplification device configured as described above will be described. The same configurations as those in the first embodiment will be omitted from description.

Figure 11:
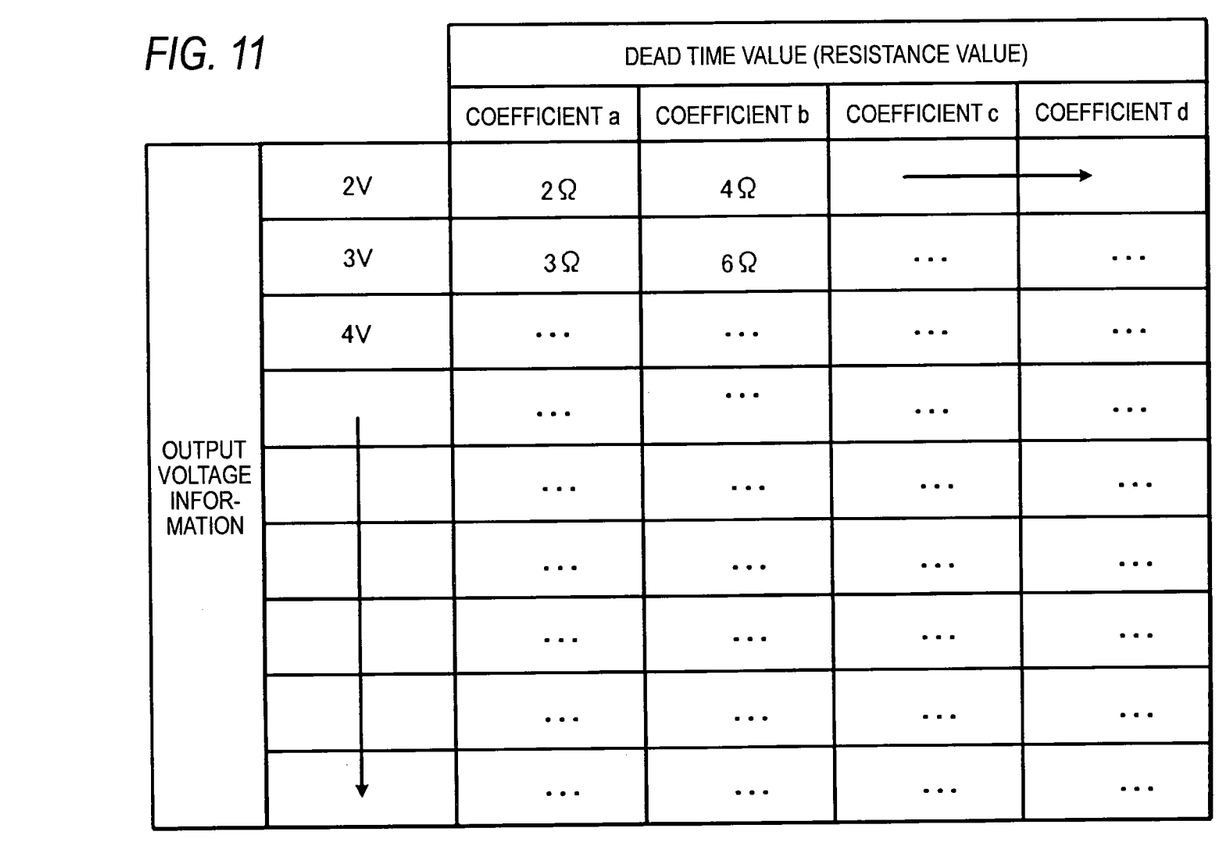
FIG. 11 illustrates data table information according to the third embodiment of the present invention.

Referring to FIG. 3, the conversion controller 301 includes a conversion circuit that converts the output voltage information such as an output voltage value output from the variable power supply 104 into the target dead time information corresponding to the output voltage, and outputs the converted target dead time information to the dead time generator 105. As illustrated in FIG. 11, the conversion circuit conducts conversion so as to maintain a relationship of the data table information configured by the output voltage, and the target dead time information represented by, for example, a resistive value. The conversion circuit controls the conversion from the output voltage value into the target dead time information so that the dead time is set to a smaller value when the output voltage is smaller, and the dead time is set to a larger value when the output voltage is larger.

As in the first embodiment, for example, the target dead time information can be selected in advance in correspondence with the dead time generating method of the dead time generator 105 by using a format such as the unit time or the voltage value without being limited to the format using the resistive value as illustrated in FIG. 11. Further, the coefficients a and b as well as the coefficients c and d can be selectively used according to the ambient temperature.

According to this configuration, the amount of heat generation in the high-speed switching elements can be suppressed particularly when the small output supply voltage is applied, and the distortion can be improved by setting the small dead time value obtained by converting the output supply voltage value.

Figure 12:
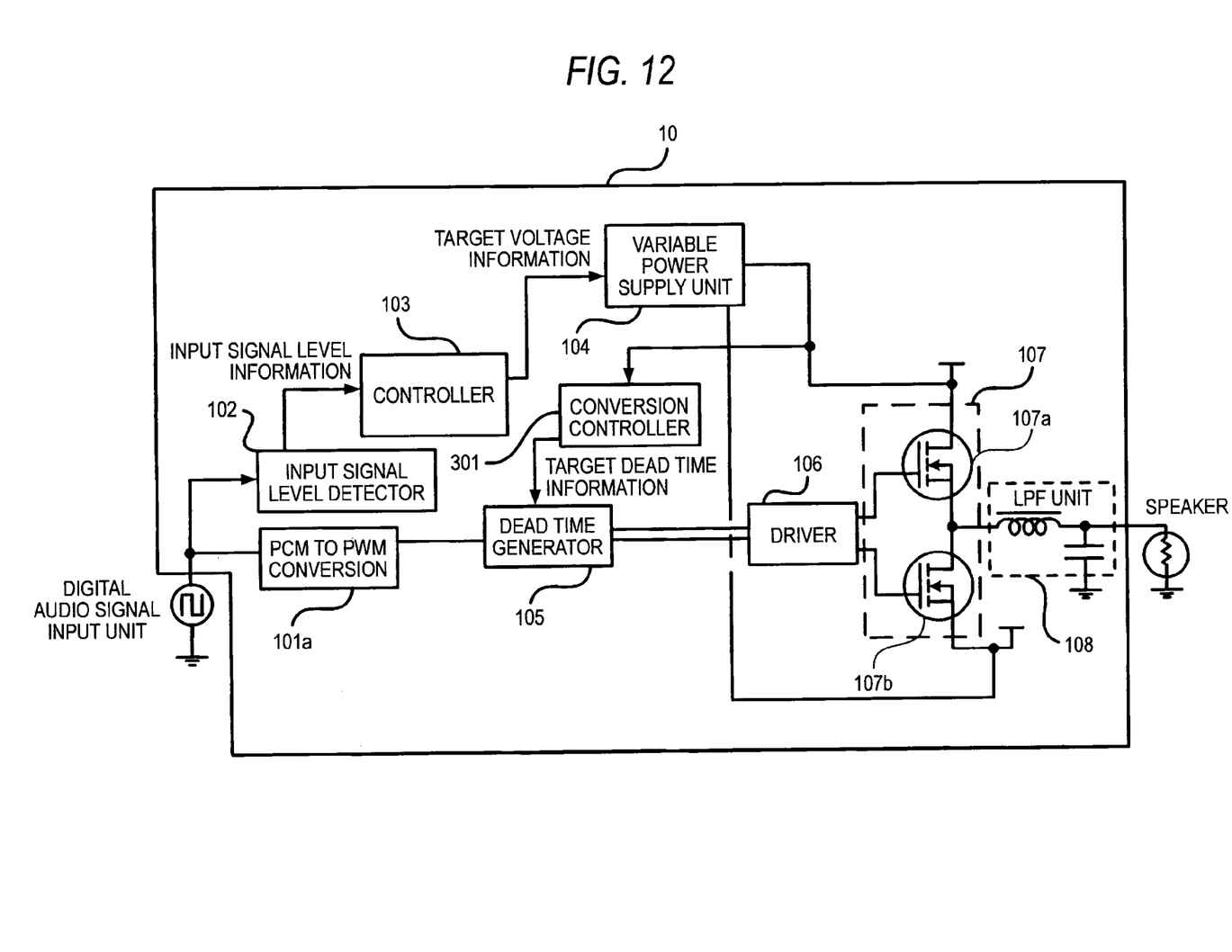
FIG. 12 is a block diagram of another example of the class D amplification device according to the third embodiment of the present invention.

Also, in the above description, when the digital audio signal such as the PCM is input instead of the analog audio signal, as illustrated in FIG. 12, the PWM converter 101 is replaced with the PCM-PWM converter 101a. As a result, the same implementation as that in the above embodiment is enabled, and the same advantages are obtained.

The present invention has been described in detail and with reference to specific embodiments. However, it would be obvious to an ordinary skilled person that the invention can be variously changed or modified without departing from the spirit and scope of the present invention.

The present invention is based on Japanese Patent Application No. 2009-153392 filed on Jun. 29, 2009, and content thereof is incorporated herein by reference.

Industrial Applicability

As has been described above, the class D amplification device according to the present invention has such advantages that the amount of heat generation in the switching elements can be suppressed by lowering the DC supply voltage value particularly at the small input signal level, and the distortion can be improved by selecting the small dead time of the values associated with the DC supply voltage value to perform both of the higher sound quality and the higher efficiency, and is useful as a class D amplifier that obtains an excellent audio characteristic.

DESCRIPTION OF REFERENCES

10, CLASS D AMPLIFICATION DEVICE
101, PWM CONVERTER
101a, PCM-PWM CONVERTER
102, INPUT SIGNAL LEVEL DETECTOR
103, CONTROLLER
104, VARIABLE POWER SUPPLY
105, DEAD TIME GENERATOR
106, DRIVER
107a, 107b, SWITCHING ELEMENTS
108, LPF
201, VOLUME ADJUSTER
301, CONVERSION CONTROLLER

The invention claimed is:

1. A class D amplification device comprising:
    A bridge circuit having a plurality of switching elements, and controls the switching elements of the bridge circuit to switch a DC supply voltage and amplify a power of an audio signal input to the subject device, and
    a controller that sets a dead time of a signal for switching the switching elements according to an input signal level of the input audio signal and sets a voltage value of the DC supply voltage according to the input signal level of the input audio signal, wherein the dead time of the signal for switching elements and the voltage value of the DC supply voltage are associated with each other.

2. A class D amplification device that includes a bridge circuit having a plurality of switching elements, and controls the switching elements of the bridge circuit to switch a DC supply voltage and amplify a power of an audio signal input to the subject device, the class D amplification device comprising:
    an input signal level detector that outputs a signal level of the input audio signal as input signal level information;
    a PWM converter that converts the input audio signal into a PWM signal and outputs the PWM signal;
    a dead time generator that sets a dead time for the PWM signal output by the PWM converter;
    a variable power supply that variably applies a voltage value to the plurality of switching elements; and
    a controller that sets target voltage information on the basis of the input signal level information to output the target voltage information to the variable power supply, and sets target dead time information associated with the target voltage information on the basis of the input signal level information to output the target dead time information to the dead time generator,
    wherein the dead time generator sets the dead time corresponding to the target dead time information for the PWM signal, and the variable power supply applies a power supply at a voltage value corresponding to the target voltage information.

3. The class D amplification device according to claim 1, wherein the controller decreases the dead time and sets the supply voltage to be smaller in accordance with the decrease of the input signal level of the input audio signal, and increases the dead time and sets the supply voltage to be larger in accordance with the increase of the input signal level of the input audio signal.

4. A class D amplification device comprising:
    a bridge circuit having a plurality of switching elements, and controls the switching elements of the bridge circuit to switch a DC supply voltage and amplify a power of an audio signal input to the subject device, and
    a controller that sets a dead time of a signal for switching the switching elements and a voltage value of the DC supply voltage according to volume adjustment information for adjusting an output signal level output by the subject device.

5. A class D amplification device that includes a bridge circuit having a plurality of switching elements, and controls the switching elements of the bridge circuit to switch a DC supply voltage and amplify a power of an audio signal input to the subject device, the class D amplification device comprising:
- a volume adjuster that outputs volume adjustment information for adjusting an output audio signal level output by the subject device;
- a PWM converter that converts the input audio signal into a PWM signal and outputs the PWM signal;
- a dead time generator that sets a dead time for the PWM signal output by the PWM converter;
- a variable power supply that variably applies a voltage value to the plurality of switching elements; and
- a controller that sets target voltage information on the basis of the volume adjustment information to output the target voltage information to the variable power supply, and sets target dead time information associated with the target voltage information on the basis of the volume adjustment information to output the target dead time information to the dead time generator,
- wherein the dead time generator sets the dead time corresponding to the target dead time information for the PWM signal, and the variable power supply applies a power supply at a voltage value corresponding to the target voltage information.

6. The class D amplification device according to claim 4, wherein the controller decreases the dead time and sets the supply voltage to be smaller in accordance with the decrease of the output audio signal level of the subject device indicated by the volume adjustment information, and increases the dead time and sets the supply voltage to be larger in accordance with the increase of the output audio signal level of the subject device indicated by the volume adjustment information.

7. A class D amplification device that includes a bridge circuit having a plurality of switching elements, and controls the switching elements of the bridge circuit to switch a DC supply voltage and amplify a power of an audio signal input to the subject device, the class D amplification device comprising:
- a controller that sets a voltage level of the DC supply voltage according to an input signal level of the input audio signal; and
- a conversion controller that sets a dead time of a signal for switching the switching elements according to an output voltage level of the DC supply voltage, wherein the input signal level of the input audio signal, the dead time of the signal for switching the switching elements, and the output voltage level of the DC supply voltage are associated with each other.

8. A class D amplification device that includes a bridge circuit having a plurality of switching elements, and controls the switching elements of the bridge circuit to switch a DC supply voltage and amplify a power of an audio signal input to the subject device, the class D amplification device comprising:
- an input signal level detector that outputs a signal level of the input audio signal as input signal level information;
- a PWM converter that converts the input audio signal into a PWM signal and outputs the PWM signal;
- a dead time generator that sets a dead time for the PWM signal output by the PWM converter;
- a variable power supply that variably applies a voltage value to the plurality of switching elements;
- a controller that sets target voltage information on the basis of the input signal level information to output the target voltage information to the variable power supply; and
- a conversion controller that converts output voltage information output from the variable power supply into target dead time information to output the target dead time information to the dead time generator,
- wherein the dead time generator sets the dead time corresponding to the target dead time information for the PWM signal, and the variable power supply applies a power supply at a voltage value corresponding to the target voltage information, and
- wherein the input signal level information, the target dead time information, and the target voltage information are associated with each other.

9. The class D amplification device according to claim 7, wherein the controller sets the supply voltage to be smaller and sets the dead time to be smaller in accordance with the decrease of the input signal level of the input audio signal, and sets the supply voltage to be larger and sets the dead time to be larger in accordance with the increase of the input signal level of the input audio signal.

10. The class D amplification device according to claim 1, wherein the PWM converter conducts a process of converting a digital signal into the PWM signal.

11. The class D amplification device according to claim 2, wherein the controller decreases the dead time and sets the supply voltage to be smaller in accordance with the decrease of the input signal level of the input audio signal, and increases the dead time and sets the supply voltage to be larger in accordance with the increase of the input signal level of the input audio signal.

12. The class D amplification device according to claim 5, wherein the controller decreases the dead time and sets the supply voltage to be smaller in accordance with the decrease of the output audio signal level of the subject device indicated by the volume adjustment information, and increases the dead time and sets the supply voltage to be larger in accordance with the increase of the output audio signal level of the subject device indicated by the volume adjustment information.

13. The class D amplification device according to claim 8, wherein the controller sets the supply voltage to be smaller and sets the dead time to be smaller in accordance with the decrease of the input signal level of the input audio signal, and sets the supply voltage to be larger and sets the dead time to be larger in accordance with the increase of the input signal level of the input audio signal.

14. The class D amplification device according to claim 2, wherein the PWM converter conducts a process of converting a digital signal into the PWM signal.

15. The class D amplification device according to claim 4, wherein the PWM converter conducts a process of converting a digital signal into the PWM signal.

16. The class D amplification device according to claim 5, wherein the PWM converter conducts a process of converting a digital signal into the PWM signal.

17. The class D amplification device according to claim 7, wherein the PWM converter conducts a process of converting a digital signal into the PWM signal.

18. The class D amplification device according to claim 8, wherein the PWM converter conducts a process of converting a digital signal into the PWM signal.

* * * * *